United States Patent
Gleissner et al.

(10) Patent No.: US 10,892,753 B2
(45) Date of Patent: Jan. 12, 2021

(54) INPUT DEVICE WITH AN ARRAY OF FORCE SENSORS OF A LAMINATED CONSTRUCTION WITH BACKLIGHTING

(71) Applicant: PREH GMBH, Bad Neustadt a. d. Saale (DE)

(72) Inventors: Ottmar Gleissner, Hohenroth (DE); Jochen Schlereth, Sondheim (DE)

(73) Assignee: PREH GMBH, Bad Neustadt a.d. Saale (DE)

( * ) Notice: Subject to any disclaimer, the term of this patent is extended or adjusted under 35 U.S.C. 154(b) by 0 days.

(21) Appl. No.: 16/348,375

(22) PCT Filed: Oct. 26, 2017

(86) PCT No.: PCT/EP2017/077432
§ 371 (c)(1),
(2) Date: May 8, 2019

(87) PCT Pub. No.: WO2018/099657
PCT Pub. Date: Jun. 7, 2018

(65) Prior Publication Data
US 2020/0067506 A1 Feb. 27, 2020

(30) Foreign Application Priority Data
Nov. 30, 2016 (DE) .......... 10 2016 123 118

(51) Int. Cl.
*H03K 17/96* (2006.01)

(52) U.S. Cl.
CPC ............ *H03K 17/9622* (2013.01); *H03K 2217/96046* (2013.01); *H03K 2217/960785* (2013.01)

(58) Field of Classification Search
CPC ..... H03K 17/9622; H03K 2217/96046; H03K 2217/960785; H03K 17/962; H03K 17/955
(Continued)

(56) References Cited

U.S. PATENT DOCUMENTS

| 6,664,489 B2 * | 12/2003 | Kleinhans ............ H03K 17/962 200/313 |
| 2007/0018965 A1 * | 1/2007 | Paun .................... H01H 13/702 345/173 |
| 2008/0012734 A1 * | 1/2008 | Ciechanowski ..... A61H 33/005 341/33 |

FOREIGN PATENT DOCUMENTS

| DE | 102013021879 A1 | 6/2015 |
| WO | 2008006212 A1 | 1/2008 |

(Continued)

OTHER PUBLICATIONS

The International Search Report and the Written Opinion for PCT/EP2017/077432, dated Feb. 2, 2018, ISA, EPO, Rijswijk, The Netherlands.

*Primary Examiner* — Edwin A. Leon
(74) *Attorney, Agent, or Firm* — M&B IP Analysts, LLC

(57) ABSTRACT

An input device, including a flat panel defining an array of control surfaces, and an array of capacitive sensors and a support. The control surfaces are on a surface of the panel facing towards the operator and the support is on a side of the panel facing away from an operator. Also, each capacitive sensor forms a measuring capacitance assigned to a control surface. Further, each capacitive sensor is formed by a common substantially flat film layer structure. The film layer structure includes a first electrode for forming the measuring capacitance. On the side of the support, a lighting device is provided for each control surface for backlighting the associated control surface and transmitting light through (Continued)

the film layer structure. Also, the input device reduces the passage of light from one capacitive sensor to an adjacent capacitive sensor.

8 Claims, 3 Drawing Sheets

(58) Field of Classification Search
USPC .......................................................... 200/600
See application file for complete search history.

(56) References Cited

FOREIGN PATENT DOCUMENTS

| | | | |
|---|---|---|---|
| WO | 2009133870 | A1 | 11/2009 |
| WO | 2011052379 | A1 | 5/2011 |
| WO | 2018099657 | A1 | 6/2018 |

* cited by examiner

INPUT DEVICE WITH AN ARRAY OF FORCE SENSORS OF A LAMINATED CONSTRUCTION WITH BACKLIGHTING

This application claims priority under 35 U.S.C. § 371 to the International Application No. PCT/EP2017/077432, filed Oct. 26, 2017, and to the German Application No. 10 2016 123 118.5, filed Nov. 30, 2016, now pending, the contents of which are hereby incorporated by reference.

The present disclosure relates to an input device comprising a flat panel defining an array of control surfaces, and an array of capacitive sensors, e.g. capacitive force sensors, and a support, wherein the control surfaces are disposed on a surface of the panel facing towards the operator, and the support is disposed on a side of the panel facing away from the operator. One of the capacitive sensors, respectively, forms one measuring capacitance assigned to one of the control surfaces. Each of the capacitive sensors is formed by a common, translucent or transparent, flat film layer structure, which includes at least one first electrode associated with the panel and optionally a second electrode, which is associated with the support, for forming the measuring capacitance. On the side of the support, at least one lighting means is provided for, and arranged so as to be correspondingly associated with, each control surface, for backlighting the respective control surface and transmitting light through the film layer structure.

This type of input devices, depending on the design of the capacitive sensor, for example, focuses on the exclusive detection of touch, or on the detection of the actuating force exerted in the process, by the capacitive sensors being configured as force sensors. There is in fact an increasing demand for such input devices in which the operator receives a haptic feedback when the operator makes an input on the input surface. In order to better distinguish random contacts on the input surface from intended actuation, and in order to be able to provide the operator, who is used to traditional mechanical operating elements, with a similar haptic feedback, such input devices were developed which permit an actuating force measurement in order to be able to generate a haptic feedback depending on the measured actuating force. In the case of input devices with an array of operating surfaces, i.e. with several operating surfaces accommodated in an extended input surface, an array of several force sensors is provided for "spatial resolution". In this case, a force sensor is assigned to each operating surface in order to be able to assign a switching function to an actuation of the individual operating surface, hereinafter also referred to as control surface, e.g. when a measured minimum actuating force of the actuation is exceeded. Compared to piezo-electric sensors, for instance, capacitive sensors are inexpensive, and a force measurement, but also the mere touch detection, with this type of sensor can be realized in a space-saving manner by using a film layer structure.

This type of capacitive sensor with a film layer structure is disadvantageous not only because backlighting is not only difficult to realize by means of a transparent or at least translucent film layer structure, but also because a light interference in adjacent control surfaces occurs, i.e. "crosstalk" with respect to the backlighting from one control surface to an adjacent control surface.

Against this background, there was a demand for a solution for an input device with an array of control surfaces and an associated array of capacitive sensors accommodated in a film layer structure, which is improved with regard to backlighting, and which, at the same time, is inexpensive to produce. This object is achieved with an input device according to claim 1. An equally advantageous use is the subject matter of the independent use claim. Advantageous embodiments are in each case the subject matter of the dependent claims. It must be noted that the features cited individually in the claims can be combined with each other in any technologically meaningful manner and represent other embodiments of the present disclosure. The description, in particular in connection with the figures, additionally characterizes and specifies the present disclosure.

The present disclosure relates to an input device comprising a flat panel defining an array of control surfaces, an array of capacitive sensors and a support. For example, the panel is configured to be elastically more yielding compared with the support and/or movably mounted with respect to the support. According to the present disclosure, the control surfaces are disposed on a surface of the panel facing towards the operator, i.e. disposed so as to be visible from the point of view of the operator, whereas, according to the present disclosure, the support is disposed on a side of the panel facing away from the operator, i.e. underneath the panel from the point of view of the operator. The term "control surface" is to be interpreted broadly, and despite the designation referring to an actuation, a mere touch without the influence of an actuating force is also to be understood to be an actuation in the sense of the present disclosure.

According to the present disclosure, each of the capacitive sensors is provided to respectively form a measuring capacitance respectively assigned to one of the several control surfaces. According to the present disclosure, the capacitive sensor has in each case at least one first electrode associated with the panel, and is thus designed, for example, to capacitively detect a touch on the associated control surface. Preferably, the capacitive sensor is in each case designed as a capacitive force sensor, and further includes at least one second electrode, which is associated with the support, for forming the measuring capacitance between the support and the panel.

For example, the mode of operation of the capacitive sensor, which is preferably configured as a capacitive force sensor, is as follows. When an actuating force acts on the respective control surface of the panel, this results in the first and second electrode converging and thus in a change in the measuring capacitance, which is detected by an evaluation unit and which, when a predetermined minimum change is exceeded, causes a switching state of a unit to be controlled with the input device to change. Preferably, the input device also has an actuating element, also referred to as actuator, for generating a haptic feedback, which is activated at the same time as or subsequent to the assignation of the switching state change by the evaluation unit.

According to the present disclosure, each of the capacitive sensors is formed by a common, translucent or transparent, substantially flat film layer structure. In the case of the capacitive sensors being designed as capacitive force sensors, the film layer structure, for each force sensor, in each case has at least one first electrode associated with the panel, and at least one second electrode associated with the support, for forming the measuring capacitance. This is not to exclude the possibility that at least one electrode of several or all force sensors is configured as a common electrode to the respective or all force sensors.

Preferably, the electrode or the electrodes are made from a conductive, transparent material or applied with such a low layer thickness, e.g. by means of metallic vapor deposition, that the result is a translucence of the electrode. For example, the film layer structure has one or several transparent films. For example, the first and second electrodes of the capacitive sensor configured as a force sensor are spaced apart from each other by an elastically yielding intermediate layer, which is integrated into the film layer structure and passes through the film layer structure over the entire surface or forms cushions in some areas, or by a distance layer, which yields comparatively little and which defines a hollow volume in each case between the first electrode and the second electrode.

According to the present disclosure, on the side of the support, which preferably consists of an opaque material, at least one lighting means, e.g. a light-emitting diode, preferably with an SMD design, is provided for each control surface, for backlighting the control surface and transmitting light through the light-conducting layer, and which is assigned to the control surface. Backlighting serves for making the control surface more easily recognizable or visible to an operator, or for displaying the switching functionality connected with the respective control surface, for example by a symbol, which is applied to the control surface, being backlit.

According to the present disclosure, means for reducing the passage of light from one capacitive sensor to an adjacent one are provided. The means prevent "crosstalk" of the backlighting from one control surface to another control surface in order thus to improve visual appearance, but also to avoid operating errors, particularly if certain switching states of the switching function associated with the respective control surface are to be made visible by the type of backlighting.

For example, the means for reducing the passage of light from one capacitive sensor to an adjacent one include several light shafts made from an opaque material, which are formed on the side of the support and in which lighting means are disposed. Preferably, one light shaft per lighting means and per control surface is formed on the support.

Preferably, the means for reducing the passage of light include an opaque, partial coating, for example printing, on the film layer structure. For example, strips of opaque paint are applied to the film layer structure in the transitional region between two adjacent force sensors. On the one hand, the opaque coating provides for shading, similar to a light barrier inserted into an optical path, so that an otherwise possible optical path from one lighting means associated with a control surface towards an adjacent control surface would be interrupted. On the other hand, the coating further provides for a reduction of the passage of light permeating the film layer structure, because light extraction occurs in the region of the coating, as well as a reduced light transmission within the film layer structure caused by total reflection.

Preferably, the coating is made from a conductive material. In order to avoid any electrostatic influence, the conductive coating is preferably connected in an electrically conductive manner to the first or second electrodes. As a result, the coating of the film layer structure can be applied in a treatment process that corresponds to that of the electrodes; preferably, the coating is applied in the same processing step.

For example, the above described opaque coating is provided on the main surface of the film layer structure facing towards the support. Preferably, however, an application of the opaque coating is provided on the main surface of the film layer structure facing towards the panel.

According to a preferred embodiment of the film layer structure, the means for reducing the passage of light have a through-hole penetrating the film layer structure at right angles to the plane of its extent, in order to impede the light transfer from one capacitive sensor to the closest adjacent capacitive sensor that takes place through the film layer structure.

According to a preferred embodiment, the panel or the support, preferably the support, has a web reaching through the through-hole. For example, the web constitutes an extension of a wall defining the above-described light shaft, in order to shield or shade each capacitive sensor, or the control surface which is to be backlit and is associated with the capacitive sensor, against the exposure to light from a lighting means associated with an adjacent capacitive sensor.

According to a preferred embodiment, the web projects above the film layer in the direction towards the panel, and engages a recess on the side of the panel like a tongue-and-groove connection, for example.

According to a preferred embodiment, the film layer structure provided according to the present disclosure comprises a scattering layer made from translucent material, for example, for visualization, particularly the visualization of symbols applied to the panel and/or the film layer structure, in order to display to the operator the switching function to be activated by the actuation.

Furthermore, the present disclosure relates to the use of the input device in one of its above-described embodiments in a motor vehicle.

The present disclosure is explained further with reference to the following figures. The Figures are to be understood only as examples and merely represent a preferred embodiment. In the Figures.

Figure 1:
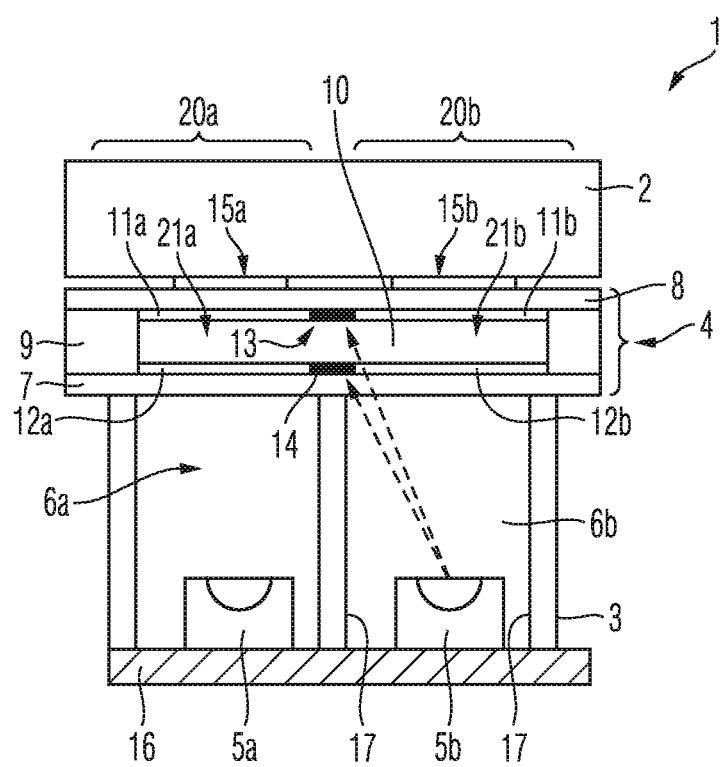
FIG. 1 shows a sectional view through a first embodiment of the input device according to the present disclosure.

FIG. 1 shows a first embodiment of the input device 1 according to the present disclosure. The input device 1 has an array of control surfaces 20a, 20b, which are defined on a surface, which faces towards the operator, of a flat panel 2 made from a translucent material such as a translucent plastic, e.g. a translucent thermoplastic material. In order to be found more easily or for displaying a switching state if required, the control surfaces 20a, 20b are to be backlit selectively. For indicating the associated switching function, which is to be activated by the actuation of the control surface 20a, 20b, corresponding symbols 15a, 15b are applied to the control surface 20a or 20b.

The input device 1 further has a support 3 made from an opaque plastic, e.g. an opaque thermoplastic material, which is disposed on the far side of the panel 2. A transparent film layer structure 4, which defines an array of capacitive force sensors 21a, 21b, is disposed between the panel 2 and the support 3, wherein exactly one of the capacitive force sensors 21a, 21b is assigned to each control surface 20a, 20b. Each of the force sensors 21a, 21b is provided for forming, by means of a evaluation unit that is not shown, a measuring capacitance between the panel 2 and the support 3, which is assigned to one of the control surfaces 20a, 20b. The film layer structure 4, for each force sensor 21, 21b, has at least one first electrode 11a, 11b associated with the panel 2, and at least one second electrode 12a, 12b associated with the support 3, for forming the above-mentioned measuring capacitance. The first electrodes 11a, 11b are formed as a translucent coating of a film of the film layer structure 4 associated with the panel 2, i.e. a film 8 closest to the panel 2, whereas the second electrodes 12a, 12b are formed as a translucent coating of a film 7 of the film layer structure 4 associated with the support 3, i.e. a film closest to the support 3. Between the films 7 and 8, a distance layer 9 is provided, which is disposed adjacent to these films 7, 8, for example glued to these films 7, 8, and which defines a cavity 10 between the electrodes that permits an elastic deformation and thus a reversible convergence of the associated electrode pairs 11a, 12a or 11b, 12b, and thus a detectable change in the associated measuring capacitance of the capacitive force sensors 21a, 21b, when an actuating force acts on the control surfaces 20a, 20b. On the side of the support 3, one lighting means 5a, 5b, respectively, is provided for each control surface 20a, 20b, for backlighting the associated control surface 20a, 20b and transmitting light through the translucent film layer structure 4. The lighting means 5a, 5b are configured in an SMD design and disposed on a circuit board 16. Furthermore, means 13, 14, 17 for reducing the passage of light from one force sensor 21a to an adjacent force sensor 21b are provided. In the embodiment shown in FIG. 1, the support 3, through the walls 17, forms one light duct 6a, 6b for each control surface 20a, 20b. Furthermore, opaque, conductive coatings 13, 14 are respectively provided on the films 7, 8, which act as light barriers in each case and in each case interrupt or block the beam path marked by the dashed arrows in order to prevent an unwanted light transfer from the light source 5b to the control surface 20a.

Figure 2:
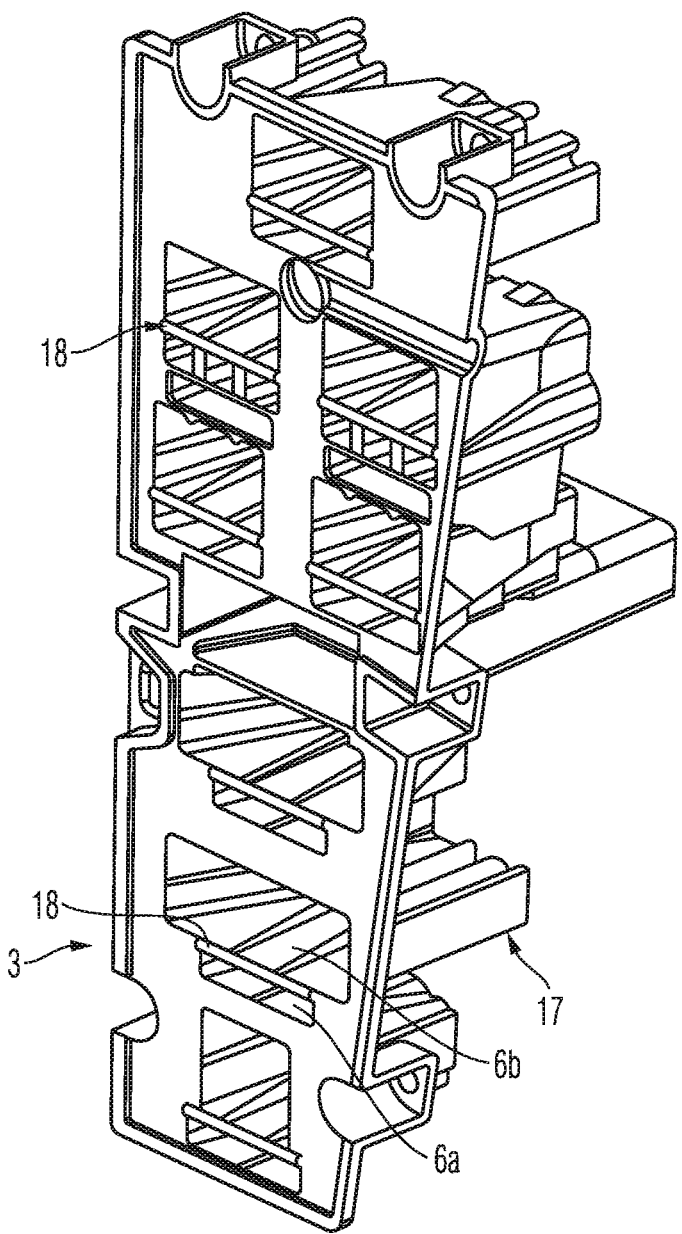
FIG. 2 shows a perspective top view of the support of a second embodiment of the input device according to the present disclosure.
Figure 3:
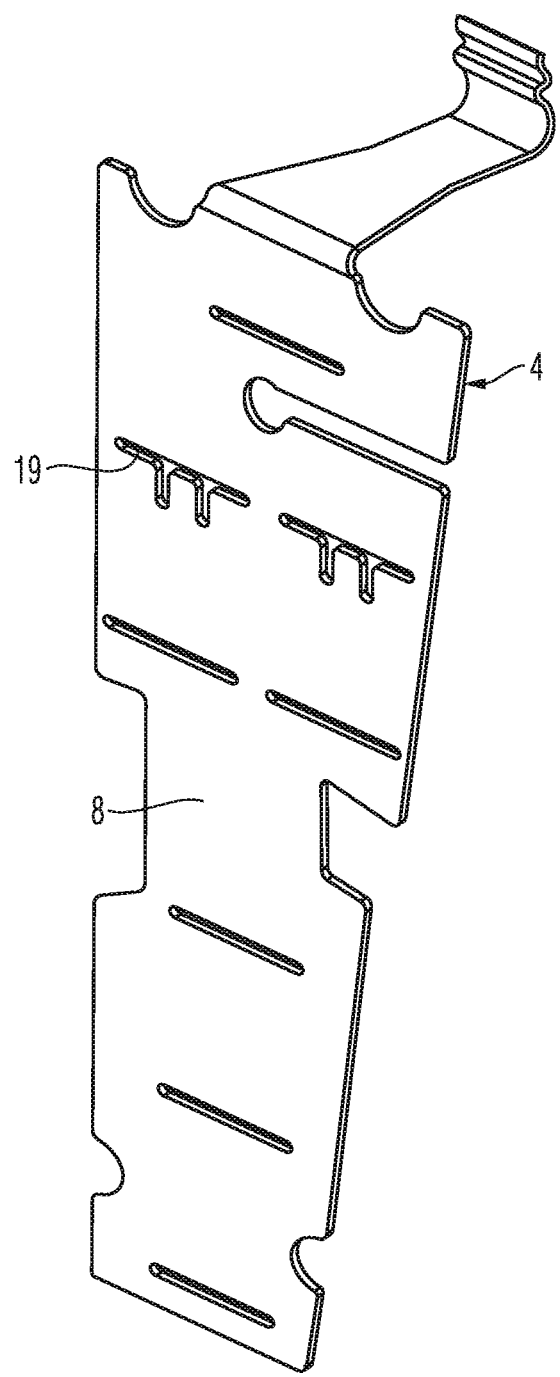
FIG. 3 shows a perspective top view of the film layer structure 4 of the second embodiment.

FIGS. 2 and 3 show a second embodiment of the input device according to the present disclosure, in particular its support 3 in FIG. 2, as well as the associated film layer structure 4 in FIG. 3. The basic structure of the panel of this embodiment, which is not shown, corresponds to that of the panel of the first embodiment shown in FIG. 1, and is therefore not shown in detail.

In this embodiment, the support 3 has webs 18 that constitute an extension of the wall 17. As FIG. 3, shows the film layer structure 4 of this embodiment has through-holes 19, through which, given a corresponding positioning of the film layer structure 4 on the support 3, the webs 18 formed on the support 3 reach and above which the webs project, and which thus form a light barrier and prevent a light transfer from one light shaft 6a to an adjacent light shaft 6b, and thus from one force sensor to an adjacent force sensor, and ultimately from one control surface to an adjacent control surface, and which therefore qualify as means for reducing the passage of light from one capacitive sensor to an adjacent capacitive sensor.

The invention claimed is:

1. An input device comprising:
    a flat panel defining an array of control surfaces, and an array of capacitive sensors as well as a support, wherein:
        the control surfaces are disposed on a surface of the panel facing towards an operator, and the support is disposed on a side of the panel facing away from the operator;
        at least one of the capacitive sensors forms a measuring capacitance assigned to one of the control surfaces, and each of the capacitive sensors is formed by a translucent or transparent, substantially flat film layer structure;
        the film layer structure, for each capacitive sensor, includes at least one first electrode associated with the panel for forming the measuring capacitance; and
        on a side of the support, at least one lighting means is provided for each control surface for backlighting the associated control surface and transmitting light through the film layer structure, wherein the input device is further configured to reduce the passage of light from one capacitive sensor to an adjacent capacitive sensor;
        the input device further includes a through-hole within the film layer structure;
        the support has a web that reaches through the through-hole; and
        the web formed by the support projects above the film layer in a direction towards the panel to reduce the passage of light.

2. The input device of claim 1, wherein the input device is further configured to reduce the passage of light via an opaque, partial coating printed on the film layer structure.

3. The input device of claim 2, wherein the coating is conductive.

4. The input device of claim 3, wherein the conductive coating is connected in an electrically conductive manner to the first or second electrodes.

5. The input device of claim 2, wherein the coating is provided on the main surface of the film layer structure facing towards the panel.

6. The input device of claim 1, wherein the capacitive sensors are configured as capacitive force sensors and each have one second electrode, which is assigned to the support, wherein the associated measuring capacitance is formed in each case between the panel and the support.

7. The input device of claim 1, wherein the film layer structure further comprises a scattering layer made from translucent material.

8. The input device of claim 1, configured for use in a motor vehicle.

\* \* \* \* \*